(12) United States Patent
Peng et al.

(10) Patent No.: US 9,584,091 B2
(45) Date of Patent: Feb. 28, 2017

(54) WIRELESS COMMUNICATION DEVICE AND METHOD OF ADJUSTING ANTENNA MATCHING

(71) Applicant: Wistron NeWeb Corporation, Hsinchu (TW)

(72) Inventors: Huang-Tse Peng, Hsinchu (TW); Hsiang-Feng Hsieh, Hsinchu (TW); Wen-Tsan Chung, Hsinchu (TW)

(73) Assignee: Wistron NeWeb Corporation, Hsinchu (TW)

( * ) Notice: Subject to any disclaimer, the term of this patent is extended or adjusted under 35 U.S.C. 154(b) by 209 days.

(21) Appl. No.: 14/248,356

(22) Filed: Apr. 9, 2014

(65) Prior Publication Data

US 2015/0200646 A1 Jul. 16, 2015

(30) Foreign Application Priority Data

Jan. 15, 2014 (TW) .............................. 103101484 A

(51) Int. Cl.
*H03H 7/40* (2006.01)
*H03H 7/38* (2006.01)
*H03H 11/28* (2006.01)
*H04B 1/38* (2015.01)
*H04B 1/04* (2006.01)
(Continued)

(52) U.S. Cl.
CPC .............. *H03H 7/40* (2013.01); *H01Q 1/243* (2013.01); *H01Q 21/28* (2013.01); *H03H 7/38* (2013.01); *H03H 11/28* (2013.01); *H04B 1/0458* (2013.01); *H04B 1/18* (2013.01); *H04B 1/38* (2013.01)

(58) Field of Classification Search
CPC combination set(s) only.
See application file for complete search history.

(56) References Cited

U.S. PATENT DOCUMENTS

| 2003/0100333 | A1* | 5/2003 | Standke et al. ............... 455/552 |
| 2009/0176463 | A1* | 7/2009 | Raaf et al. .................... 455/101 |
| 2013/0012140 | A1* | 1/2013 | Besoli et al. .................. 455/73 |

FOREIGN PATENT DOCUMENTS

| CN | 101467305 A | 6/2009 |
| TW | 201234795 | 8/2012 |
| TW | 201304276 | 1/2013 |

* cited by examiner

*Primary Examiner* — Ankur Jain
*Assistant Examiner* — Zhitong Chen
(74) *Attorney, Agent, or Firm* — Winston Hsu; Scott Margo

(57) ABSTRACT

A wireless communication device includes a diversity antenna operating in a receiving frequency band to receive a receiving signal in the reception frequency band, a tunable matching circuit for adjusting a matching of the diversity antenna according to a control signal, a detection circuit for detecting a wireless communication system corresponding to the receiving signal to generate a detection result, wherein the detection result indicates an antenna configuration and a transmission frequency band corresponding to the wireless communication system, and a radio-frequency processing circuit for determining whether to adjust the matching of the diversity antenna to weaken antenna performance of the diversity antenna in both or one of the transmission frequency band and the reception frequency band according to the antenna configuration so as to improve an isolation between the diversity antenna and a main antenna.

7 Claims, 5 Drawing Sheets

(51) Int. Cl.
*H04B 1/18* (2006.01)
*H01Q 1/24* (2006.01)
*H01Q 21/28* (2006.01)

FIG. 1

WIRELESS COMMUNICATION DEVICE AND METHOD OF ADJUSTING ANTENNA MATCHING

BACKGROUND OF THE INVENTION

1. Field of the Invention

The present invention relates to a wireless communication device and method of adjusting antenna matching in particular capable of automatically adjusting antenna matching such that an isolation between dual antennas is optimized at any moment.

2. Description of the Prior Art

Wireless communication devices, such as mobile phones, tablet computers and laptop computers, receive and transmit wireless signals by an antenna for exchanging radio waves to access the Internet. Different wireless communication systems are developed as the wireless technology advances, and a number of antennas with which the wireless communication device is equipped may be increased in order to adapt to the different wireless communication systems. Antenna configurations corresponding to the wireless communication system supported by the wireless communication devices are listed in the following Table 1:

TABLE 1

| Antenna Configuration | Wireless Communication System |
|---|---|
| One main antenna | 2G: GSM (GPRS, EDGE) |
| One main antenna and One auxiliary antenna | 3G: UMTS (WCDMA, HSPA), CDMA2000 (1xRTT, EV-DO) |
| Two main antennas | 4G: LTE |

In detail, the second generation mobile communication system, hereafter called 2G system, including Global System for Mobile communication (GSM) is a single-input single-output (SISO) system configured with only one antenna, and the wireless communication device is equipped with single antenna for receiving and transmitting. The third generation mobile communication system, hereafter called 3G system, including Universal Mobile Telecommunication System (UMTS) and supporting Code Division Multiple Access (CDMA) technique is a single-input multi-output (SIMO) system configured with dual antennas, and the wireless communication device is equipped with a main antenna for receiving and transmitting and an auxiliary antenna for receiving only. The fourth generation mobile communication system, hereafter called 4G system, including Long Term Evolution (LTE) system is a multi-input multi-output (MIMO) system configured with dual antennas, and the wireless communication device is equipped with two main antennas for receiving and transmitting, which is also known as antenna diversity.

Moreover, different telecommunication operators may utilize different wireless communication techniques, even though the wireless communication techniques are the same, operating frequencies may be different in different areas. Thus, a demand for a wireless communication device capable of supporting multiple wireless communication techniques and operating frequencies appears, which allows the wireless communication device communicating with base stations in different areas and supporting different wireless communication techniques.

Nowadays, most of the wireless communication devices are configured with dual antennas in advance for supporting the MIMO, SIMO and SISO systems and multiple operating frequencies. However, an isolation between two or more antennas shall be considered carefully if they are operating in the same frequencies. If the isolation between the dual antennas is bad, transmitting and receiving efficiencies of the dual antennas is effectively weakened.

With dual antennas configuration, the diversity antenna (i.e. the another main antenna) is used for receiving only when the wireless communication device is switched from the MIMO system to the SIMO system, and if the isolation between the main and diversity antennas in a transmitting band is bad, a transmitting efficiency of the main antenna in the transmitting band is effectively weakened. On the other hand, only the main antenna is required when the wireless communication device is switched from the MIMO or SIMO systems to the SISO system, and if the isolation between the main and diversity or auxiliary antennas is bad, transmitting and receiving efficiencies of the main antenna is effectively weakened.

Therefore, how to adjust and optimize the isolation between dual antennas whenever the wireless communication device is switching the wireless communication system from one to another is a topic in the industry.

SUMMARY OF THE INVENTION

It is therefore an objective of the present invention to provide a wireless communication device and method of adjusting antenna matching capable of automatically adjusting antenna matching such that an isolation between dual antennas is optimized whenever the wireless communication device is switching the wireless communication system from one to another.

The present invention discloses a wireless communication device including a main antenna operating in a receiving frequency band to receive a receiving signal in the receiving frequency band, a diversity antenna operating in the receiving frequency band to receive the receiving signal in the receiving frequency band, a tunable matching circuit coupled to the main antenna and the diversity antenna for adjusting a matching of the diversity antenna according to a control signal, a detection unit coupled to the tunable matching circuit for detecting a wireless communication system corresponding to the receiving signal to generate a detection result, wherein the detection result indicates an antenna configuration and a transmitting frequency band corresponding to the wireless communication system, and a radio-frequency processing circuit coupled to the detection unit and the tunable matching circuit for determining whether to adjust the matching of the diversity antenna according to the antenna configuration indicated by the detection result to output the control signal to the tunable matching circuit, such that the tunable matching circuit adjusts the matching of the diversity antenna to conform the antenna configuration, wherein the radio-frequency processing circuit determines whether to weaken an antenna performance of the diversity antenna in both or one of the transmitting frequency band and the receiving frequency band according to the antenna configuration to improve an isolation between the diversity antenna and the main antenna.

The present invention further discloses a method of adjusting antenna matching for a wireless communication device including a main antenna and a diversity antenna operating in a receiving frequency band, and including receiving the receiving signal by the main antenna and the diversity antenna, detecting a wireless communication system corresponding to the receiving signal to output a detection result, wherein the detection result indicates an antenna configuration and a transmitting frequency band corresponding to the wireless communication system, determining whether to adjust a matching of the diversity antenna according to the antenna configuration indicated by the detection result to output a control signal for adjusting the matching of the diversity antenna, and adjusting the matching of the diversity antenna according to the control signal to conform to the antenna configuration, wherein the antenna configuration indicates whether to weaken an antenna performance of the diversity antenna in both or one of the transmitting frequency band and the receiving frequency band to improve an isolation between the diversity antenna and the main antenna.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 is a schematic diagram of a wireless communication device according to an embodiment of the present invention.

DETAILED DESCRIPTION

Figure 1:
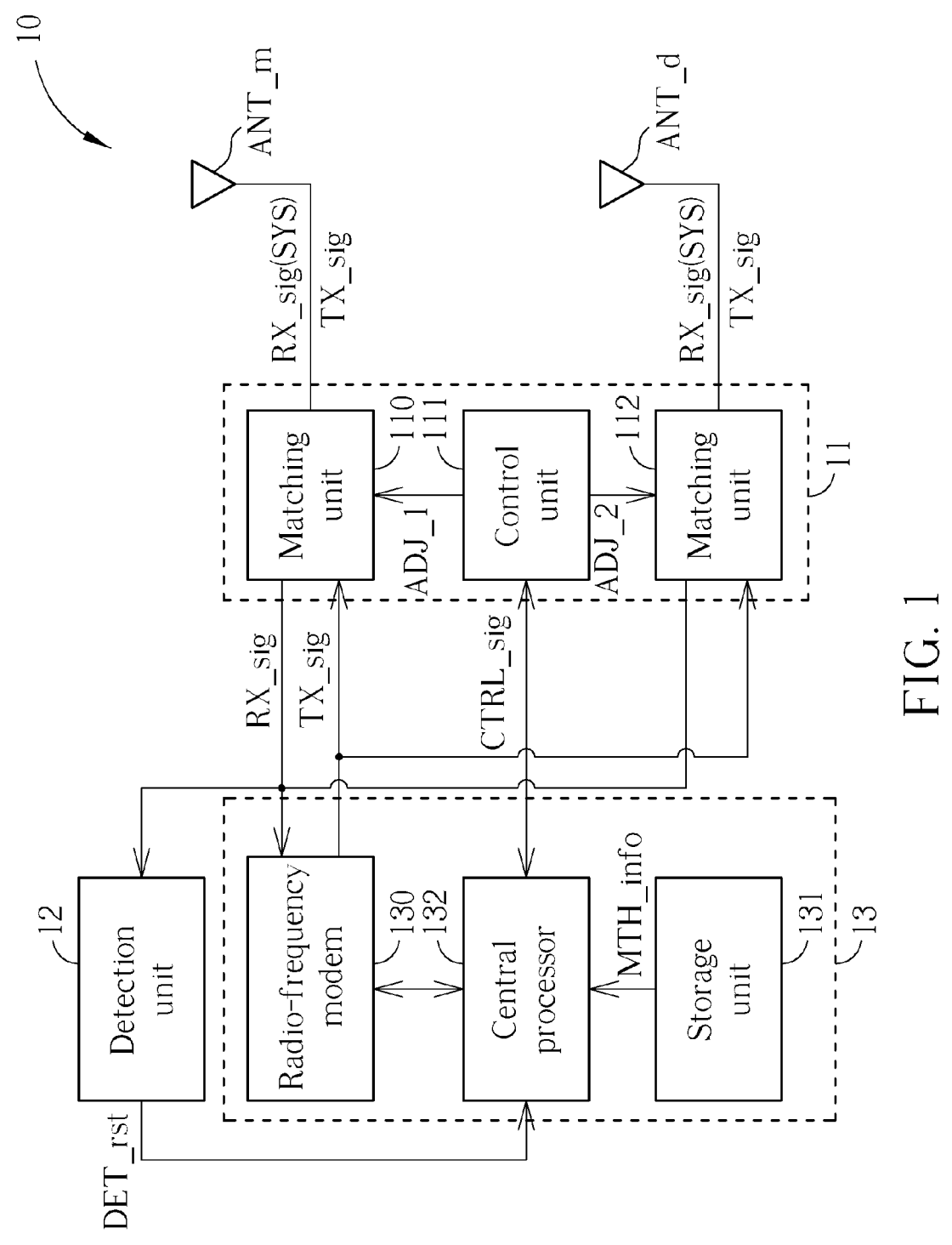
Figure 2A:
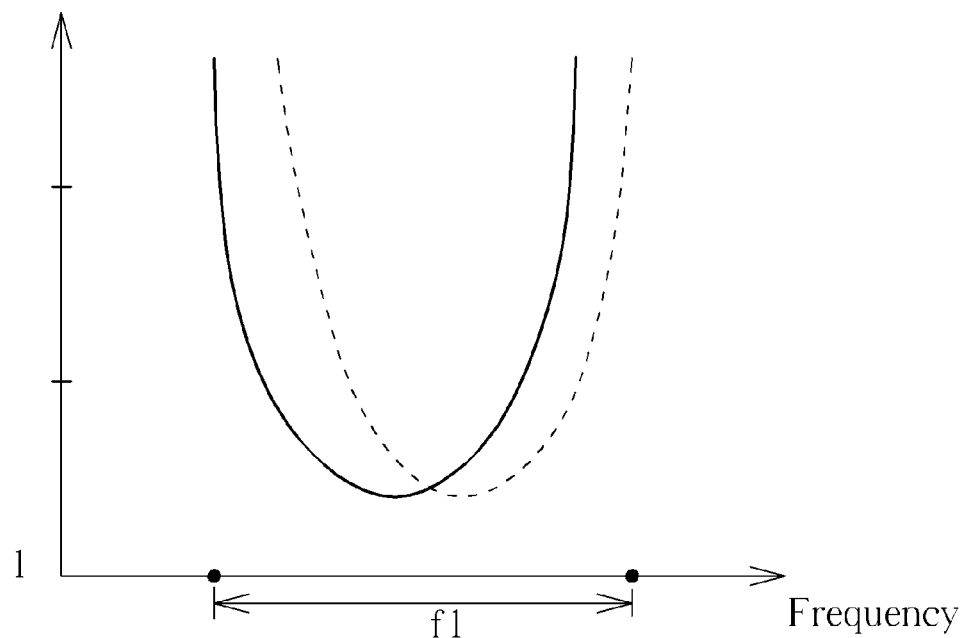
FIG. 2A to FIG. 2D are comparison charts of voltage standing wave ratios between the main and diversity antenna shown in FIG. 1.

Please refer to FIG. 1, which is a schematic diagram of a wireless communication device 10 according to an embodiment of the present invention. The wireless communication device 10 may be a mobile device capable of wireless communication, such as a mobile phone, a tablet computer, a laptop computer and so on. The wireless communication device 10 in this embodiment for example is configured with two main antennas for receiving and transmitting. Unlimitedly, the wireless communication device 10 may be configured with one main antenna and one auxiliary antenna for receiving only, and a matching of the auxiliary antenna is adjusted only in the receiving frequency band.

As shown in FIG. 1, the wireless communication device 10 includes a main antenna ANT_m, a diversity antenna ANT_d, a tunable matching circuit 11, a detection unit 12 and a radio-frequency processing circuit 13. The main antenna ANT_m and the diversity antenna ANT_d operates in a transmitting frequency band and a receiving frequency band to transmit a transmitting signal TX_sig and receive a receiving signal RX_sig. The tunable matching circuit 11 is coupled to the main antenna ANT_m and the diversity antenna ANT_d for adjusting matching of the main antenna ANT_m and the diversity antenna ANT_d according to a control signal CTRL_sig. The detection unit 12 is coupled to the tunable matching circuit 11 for outputting a detection result DET_rst, wherein the detection result DET_rst indicates a wireless communication system SYS corresponding to the receiving signal RX_sig, and the wireless communication system SYS indicates an antenna configuration as listed in Table 1. The radio-frequency processing circuit 13 is coupled to the detection unit 12 for determining whether to adjust the matching of the main antenna ANT_m and the diversity antenna ANT_d according to the detection result DET_rst to output the control signal CTRL_sig to the tunable matching circuit 11, thereby controls the tunable matching circuit 11 to adjust the matching of the main antenna ANT_m and the diversity antenna ANT_d.

The tunable matching circuit 11 includes matching units 110 and 112 and a control unit 111. The matching unit 110 is coupled to the main antenna ANT_m for matching the main antenna ANT_m. The matching unit 112 is coupled to the diversity antenna ANT_d for matching the diversity antenna ANT_d. The control unit 111 is coupled to the radio-frequency processing circuit 13 and the matching units 110 and 112 for generating adjusting signals ADJ_1 and ADJ_2 to the matching units 110 and 112 according to the control signal CTRL_sig to respectively adjust the matching of the main antenna ANT_m and the diversity antenna ANT_d.

The radio-frequency processing circuit 13 includes a radio-frequency modem 130, a storage unit 131 and a central processor 132. The radio-frequency modem 130 is used for demodulating the receiving signal RX_sig to retrieve data being accessed by the central processor 132. The storage unit 131 is used for storing a matching information MTH_info. The central processor 132 is coupled to the radio-frequency modem 130, the detection unit 12 and the storage unit 131 for determining whether to adjust the matching of the main antenna ANT_m and the diversity antenna ANT_d according to the detection result DET_rst. If the matching of the main and diversity antennas ANT_m and ANT_d should be adjusted, the central processor 132 generates the control signal CTRL_sig according to the matching information MTH_info to the control unit 11. In addition, the radio-frequency processing circuit 13 is further used for generating the transmitting signal TX_sig to the main antenna ANT_m and the diversity antenna ANT_d according to the wireless communication system SYS indicated by the detection result DET_rst and data outputted by the central processor 132, thereby the main antenna ANT_m and the diversity antenna ANT_d may transmit the transmitting signal TX_sig to realize wireless communication between the wireless communication device 10 and base stations.

In operation, when a user enables the wireless communication function of the wireless communication device 10, the wireless communication device 10 receives the receiving signal RX_sig from the base stations in the environment by the main antenna ANT_m and the diversity antenna ANT_d, and the detection unit 12 then detects a carrier frequency of the receiving signal RX_sig or a measurement report reported from the base stations, e.g. received signal strength indication (RSSI), to generate the detection result DET_rst to the central processor 132. The central processor 132 may know the wireless communication system SYS utilized by the base stations is MIMO, SIMO or SISO system according to the detection result DET_rst to determine whether to adjust the matching of the main antenna ANT_m and the diversity antenna ANT_d. If the matching of the antennas requires to be adjusted, the central processor 132 accesses the matching information MTH_info from the storage unit 131 to generate the control signal CTRL_sig to the control unit 111. The control unit 111 generates the adjusting signals ADJ_1 and ADJ_2 according to the control signal CTRL_sig to the matching units 110 and 112 to respectively adjust the matching of the main antenna ANT_m and the diversity antenna ANT_d.

In detail, if the detection result DET_rst indicates the wireless communication system SYS is the MIMO system (e.g. 4G: LTE system), the matching of the main antenna ANT_m and the diversity antenna ANT_d remain unchanged since they are defaulted and used for transmitting and receiving.

If the detection result DET_rst indicates that the wireless communication system SYS is the SIMO system (e.g. 3G: HSPA or CDMA2000 system), herein the diversity antenna ANT_d is used for receiving only, and the central processor 132 outputs the control signal CTRL_sig to control the tunable matching circuit 11 to adjust the matching of the diversity antenna ANT_d, such that the diversity antenna ANT_d does not operate in the transmitting frequency band, which reduces an influence of the diversity antenna ANT_d to the main antenna ANT_m in the transmitting frequency band. As a result, the isolation between the main antenna ANT_m and the diversity antenna ANT_d in the transmitting frequency band is effectively improved.

If the detection result DET_rst indicates that the wireless communication system SYS is the SISO system (e.g. 2G: GSM system), herein the diversity antenna ANT_d is not used for receiving and transmitting, and the central processor 132 outputs the control signal CTRL_sig to control the tunable matching circuit 11 to adjust the matching of the diversity antenna ANT_d in the transmitting and receiving frequency bands, such that the diversity antenna ANT_d does not operate in the transmitting and receiving frequency bands, which reduces an influence of the diversity antenna ANT_d to the main antenna ANT_m in the transmission and receiving frequency bands. As a result, the isolation between the main antenna ANT_m and the diversity antenna ANT_d in the transmission and receiving frequency bands are effectively improved.

Furthermore, the control signal CTRL_sig may indicate to the tunable matching circuit 11 to perform one of the following tree modes for matching adjustment:
(1) Shift operating frequency
(2) Adjust antenna performance
(3) Adjust antenna performance and shift operating frequency Specifically, please refer to FIG. 2A to FIG. 2D, which are comparison charts of voltage standing wave ratios (VSWRs) between the main antenna ANT_m and the diversity antenna ANT_d. The VSWRs of the main antenna ANT_m and the diversity antenna ANT_d are denoted with a solid line and a dashed line, respectively. The VSWRs may reflect the antenna performance, i.e. the VSWR corresponding to a certain frequency is closer to 1, and the antenna performance at the certain frequency is better; on the contrary, the VSWR is farther away from 1, the antenna performance is worse. In addition, radiating patterns of two antennas are similar if their VSWR patterns are similar, and thus the isolation between the two antennas could be worse; on the contrary, radiating patterns of two antenna are different if their VSWR patterns are different, and thus the isolation between the two antennas could be better.

It is assumed in FIG. 2A that the wireless communication device 10 is configured with dual antennas. The VSWR patterns of the main antenna ANT_m and the diversity antenna ANT_d are similar in an operating frequency band f1 covering the transmission and receiving frequency bands to be used for transmitting and receiving and supporting the MIMO system.

Figure 2B:
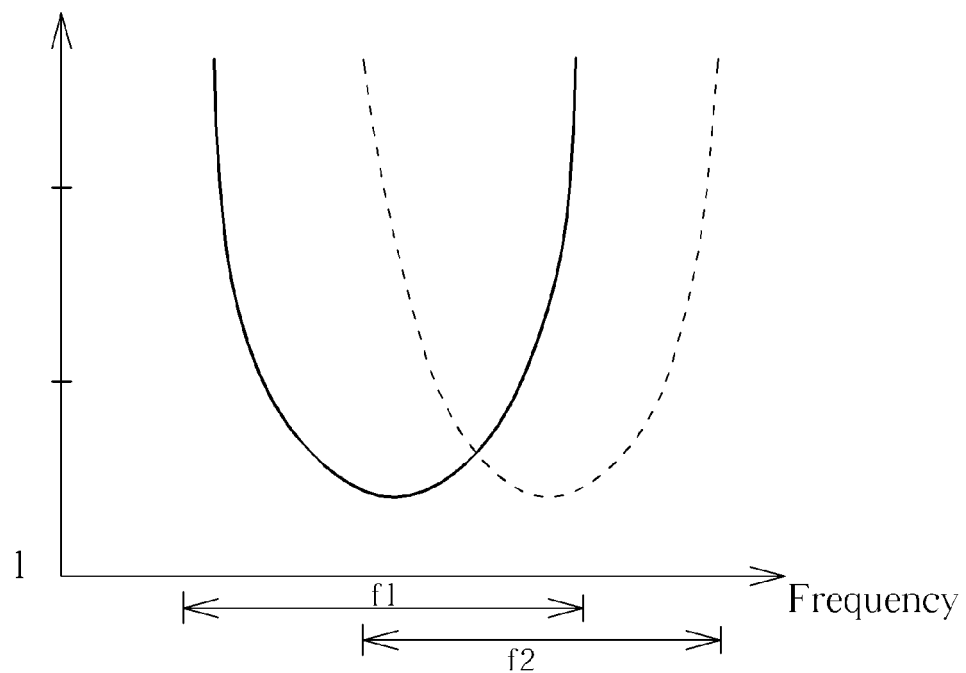

FIG. 2B illustrates the VSWR of the diversity antenna ANT_d after the matching of the diversity antenna ANT_d is adjusted according to the mode (1). The operating frequency band of the diversity antenna ANT_d is shifted from the operating frequency band f1 to an operating frequency band f2 covering the receiving frequency band only, such that the antenna performance of the diversity antenna ANT_d is weakened in the operating frequency band f1, which effectively improves the isolation between the main antenna ANT_m and the diversity antenna ANT_d in the transmitting frequency band.

Figure 2C:
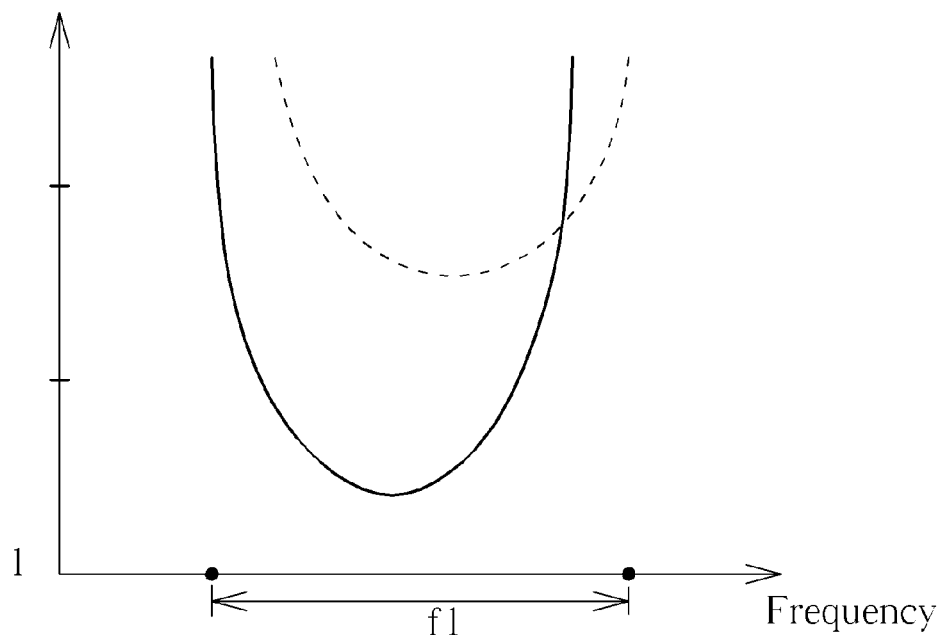

FIG. 2C illustrates the VSWR of the diversity antenna ANT_d after the matching of the diversity antenna ANT_d is adjusted according to the mode (2). The VSWR of the diversity antenna ANT_d is tuned away from 1 in the operating frequency band f1, such that the antenna performance of the diversity antenna ANT_d in the operating frequency band f1 is decreased, which effectively improves the isolation between the main antenna ANT_m and the diversity antenna ANT_d in the transmission and receiving frequency bands.

Figure 2D:
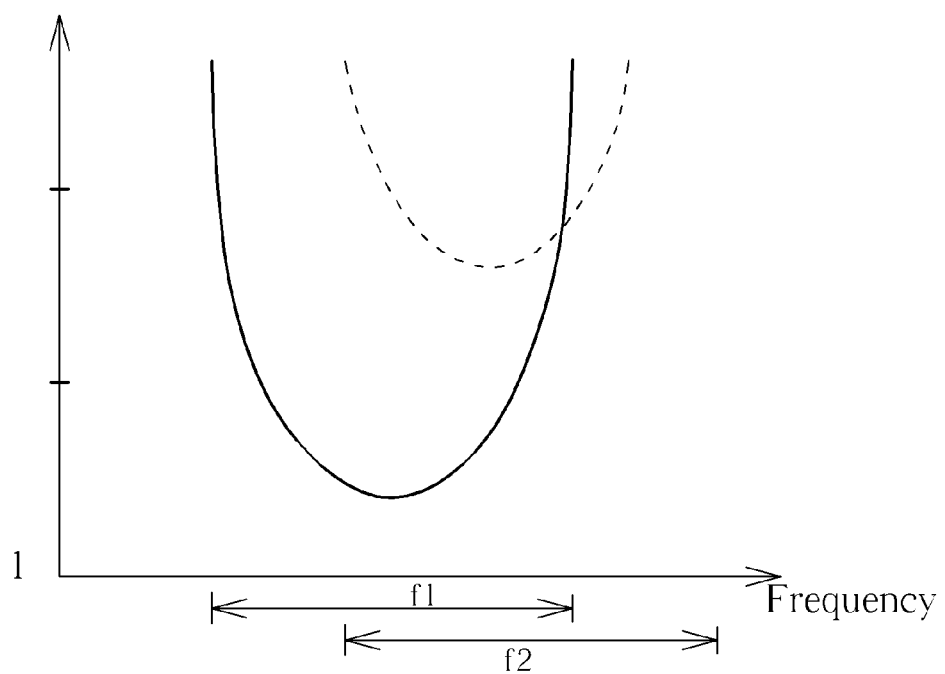

FIG. 2D illustrates the VSWR of the diversity antenna ANT_d when the matching of the diversity antenna ANT_d is adjusted according to the mode (3). The operating frequency band of the diversity antenna ANT_d is shifted from the operating frequency band f1 to the operating frequency band f2 covering the receiving frequency band only, and the VSWR of the diversity antenna ANT_d is tuned away from 1, such that the antenna performance of the diversity antenna ANT_d is weakened in the operating frequency bands f1 and f2, which effectively improves the isolation between the main antenna ANT_m and the diversity antenna ANT_d in the transmission and receiving frequency bands.

Under the operation as mentioned above, the detection unit 12 may always detect the receiving signal RX_sig from any base stations to determine whether to switch the wireless communication system SYS currently in use to another, thereby automatically and dynamically adjust the matching of the diversity antenna ANT_d in order to optimize the isolation between the main antenna ANT_m and the diversity antenna ANT_d when the wireless communication function of the wireless communication device 10 is turned on and the wireless communication device 10 is roaming around.

For example, if the wireless communication device 10 is switched from the MIMO system to the SIMO system, the wireless communication device 10 may adjust the matching of the diversity antenna ANT_d according to the mode (1) to operate in the receiving frequency band only because the diversity antenna ANT_d is used for receiving only in the SIMO system. If the wireless communication device 10 is switched from the MIMO or SIMO system to the SISO system, the wireless communication device 10 may adjust the matching of the diversity antenna ANT_d according to the mode (2) or (3) to not operate in the transmission and receiving frequency bands because the diversity antenna ANT_d is not used for receiving and transmitting in the SISO system. Vice versa, if the wireless communication device 10 is switched from the SIMO or SISO system to the MIMO system, the wireless communication device 10 may adjust the matching of the diversity antenna ANT_d back to default, such that the diversity antenna ANT_d is able to receive and transmit signals to support the MIMO system.

Simply speaking, the wireless communication device 10 of the present invention may detect the wireless communication system corresponding to the receiving signal in the environment to automatically and dynamically adjust the matching of the diversity antenna in the transmitting frequency band or the receiving frequency band, e.g. to weaken the antenna performance of the diversity antenna in the transmitting frequency band or the receiving frequency band, to reduce the influence of the diversity antenna to the main antenna, which effectively improves the isolation between the main antenna and the diversity antenna. As a result, the wireless communication device 10 of the present invention may optimize the isolation between the dual antennas according to the wireless communication system. Those skilled in the art may make modifications and alterations accordingly without limitations.

For example, a direction toward where the VSWR is shifted is not limited, except for the VSWR of the diversity antenna ANT_d is shifted from the lower operating frequency band f1 to the higher operating frequency band f2 illustrated in FIG. 2B, the operating frequency of the diversity antenna ANT_d may be shifted to a lower frequency band than the operating frequency band f1 according to practical requirements.

Figure 3:
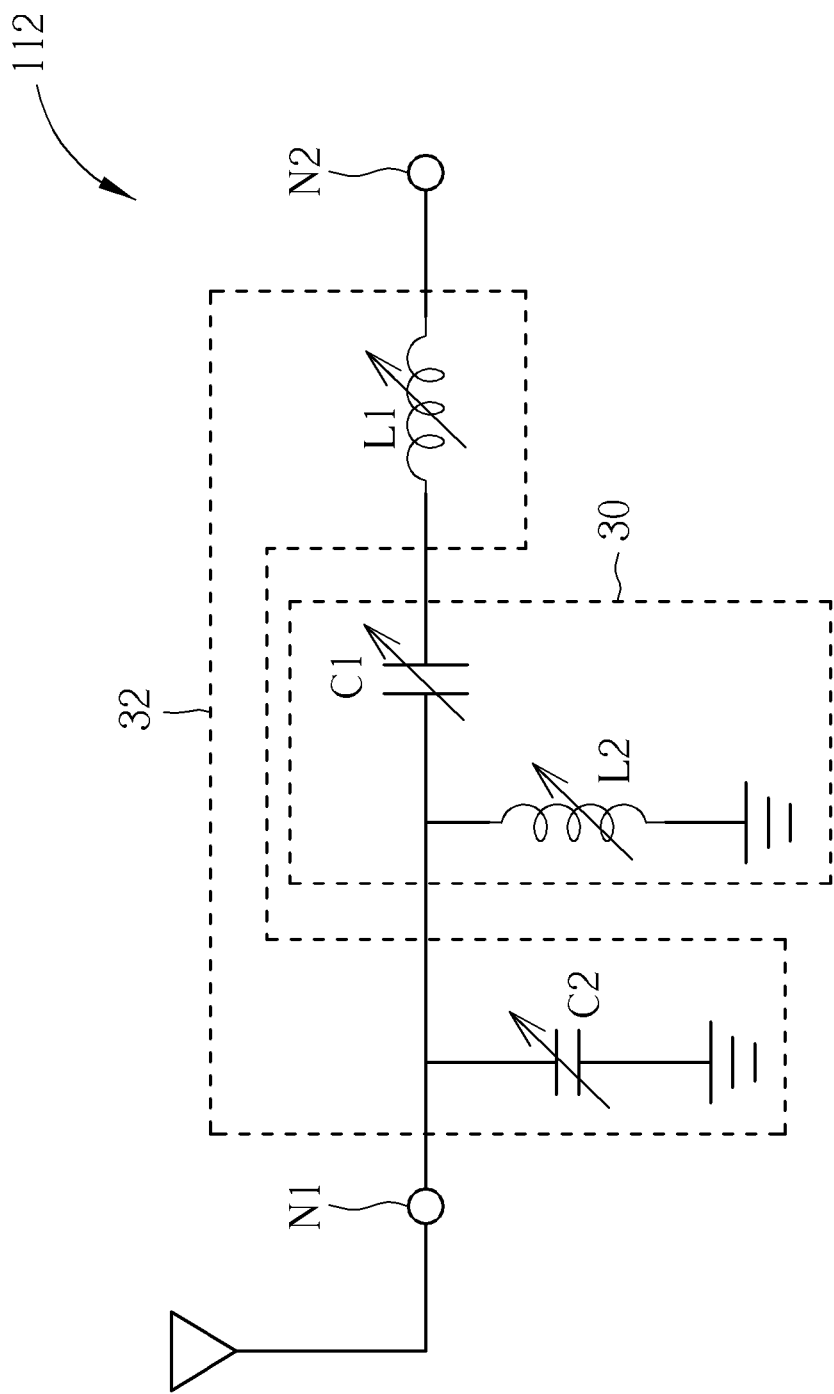
FIG. 3 is a schematic diagram of the matching unit shown in FIG. 1 according to an embodiment of the present invention.

Please refer to FIG. 3, which is a schematic diagram of the matching unit 112 according to an embodiment of the present invention. As shown in FIG. 3, the matching unit 112 includes nodes N1 and N2, capacitors C1 and C2 and inductors L1 and L2. The node N1 is coupled to the diversity antenna ANT_d, the node N2 is coupled to the detection unit 12. The capacitor C1 is coupled to node N1. The capacitor C2 includes one end coupled to the node N1 and another end coupled to a ground terminal. The inductor L1 includes one end coupled to the capacitor C1 and another end coupled to the node N2. The inductor L2 includes one end coupled to the node N1 and another end coupled to the ground terminal.

Please note that, different from traditional Pi($\pi$)-type or T-type matching circuits, the present invention cascades two filters for adjusting an input impedance of the antenna, i.e. the matching between the antenna and the radio-frequency processing circuit 13 to support multiple operating frequency bands. In detail, the capacitor C1 and the inductor L2 function as a filter or a low-frequency adjusting unit 30, the tunable matching circuit 11 adjusts both or one of a capacitance of the capacitor C1 and an inductance of the inductor L2 to adjust the matching of the diversity antenna ANT_d in a low frequency band. On the other hand, the capacitor C2 and the inductor L1 function as another filter or a high frequency adjusting unit 32, the tunable matching circuit 11 adjusts both or one of a capacitance of the capacitor C2 and an inductance of the inductor L1 to adjust the matching of the diversity antenna ANT_d in a high frequency band.

The matching information MTH_info may include the capacitances of the capacitors C1 and C2 and the inductances of the inductors L1 and L2 corresponding to the operating frequency bands and the wireless communication system SYS which the main antenna ANT_m and the diversity antenna ANT_d operate. Preferably, the capacitors C1 and C2 and the inductors L1 and L2 are electrically tunable to adjust their capacitances and inductances according to the adjusting signals ADJ_1 and ADJ_2, wherein the capacitances of the capacitors C1 and C2 are tunable in a range from 0.2 to 15 picofarads, and the inductances of the inductors L1 and L2 are tunable in a range from 1 to 33 nanohenries.

Noticeably, FIG. 3 illustrates a circuit structure of the matching unit 112 for example, which can be applied to the matching units 110 as well. Therefore, for the matching unit 110, the node N1 is coupled to the main antenna ANT_m, and the circuit structure of other elements such as the capacitors and inductors is identical with the circuit structure of the matching unit 112.

Figure 4:
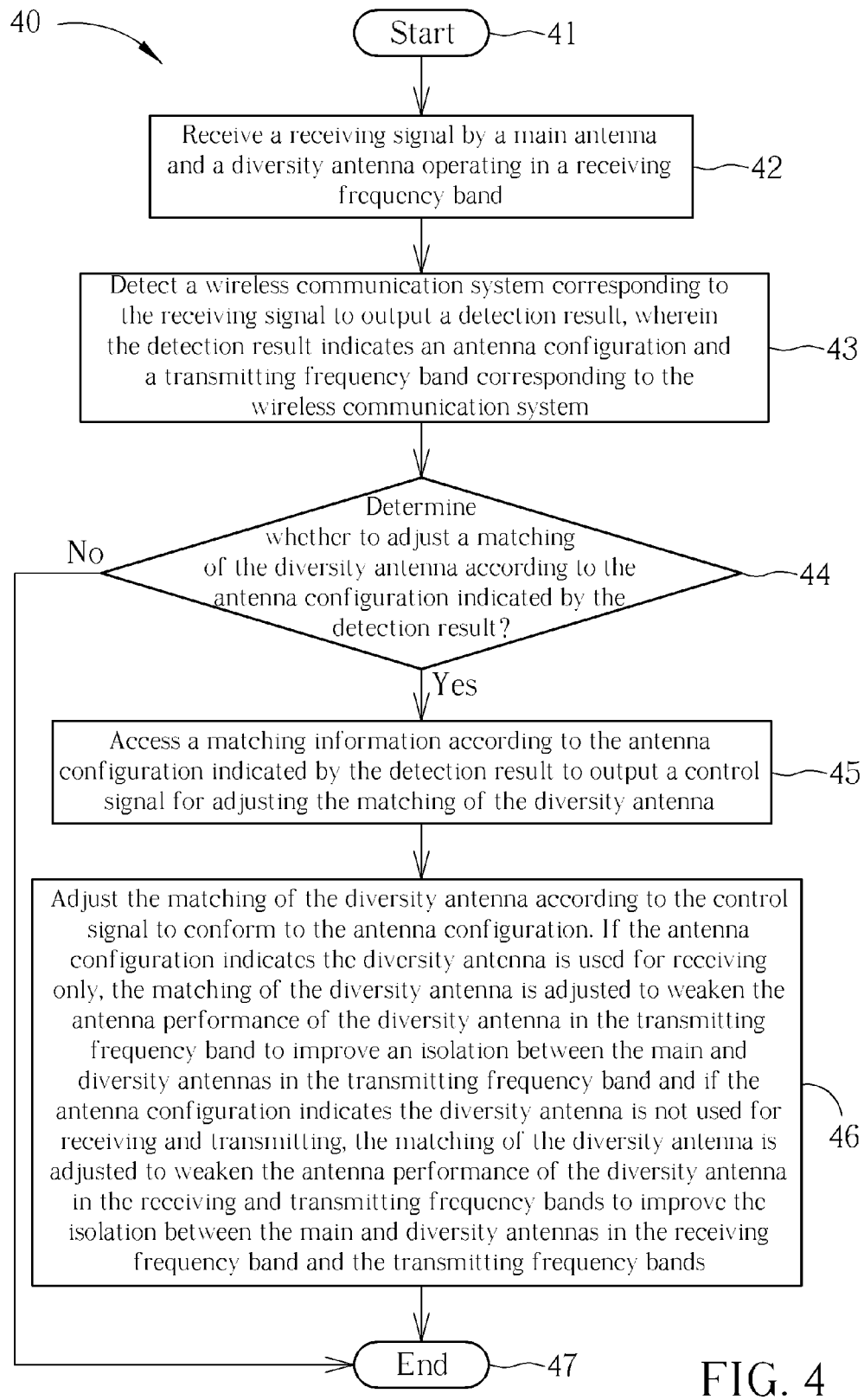
FIG. 4 is a schematic diagram of a process according to an embodiment of the present invention.

Please refer to FIG. 4, which is a schematic diagram of a process 40 according to an embodiment of the present invention. The process 40 may be utilized in the wireless communication device 10 shown in FIG. 1 for adjusting antenna matching, such that the isolation between the dual antennas can be optimized at any moment. The process 40 includes the following steps:

adjusting the matching of the diversity antenna according to the control signal to conform to the antenna configuration Step 41: Start.

Step 42: Receive a receiving signal by a main antenna and a diversity antenna operating in a receiving frequency band.

Step 43: Detect a wireless communication system corresponding to the receiving signal to output a detection result, wherein the detection result indicates an antenna configuration and a transmitting frequency band corresponding to the wireless communication system.

Step 44: Determine whether to adjust a matching of the diversity antenna according to the antenna configuration indicated by the detection result. Go to Step 45 if yes; go to Step 47 if no.

Step 45: Access a matching information according to the antenna configuration indicated by the detection result to output a control signal for adjusting the matching of the diversity antenna.

Step 46: Adjust the matching of the diversity antenna according to the control signal to conform to the antenna configuration. If the antenna configuration indicates the diversity antenna is used for receiving only, the matching of the diversity antenna is adjusted to weaken the antenna performance of the diversity antenna in the transmitting frequency band to improve an isolation between the main and diversity antennas in the transmitting frequency band; and if the antenna configuration indicates the diversity antenna is not used for receiving and transmitting, the matching of the diversity antenna is adjusted to weaken the antenna performance of the diversity antenna in the receiving and transmitting frequency bands to improve the isolation between the main and diversity antennas in the receiving frequency band and the transmitting frequency bands.

Step 47: End.

In the process 40, Step 42 illustrates an operation of the main antenna ANT_m and the diversity antenna ANT_d, Step 43 illustrates an operation of the detection unit 12, Steps 44 to 47 illustrate operations of the radio-frequency processing circuit 13. Detailed descriptions of elements and signals mentioned in the process 40 can be obtained by referring to descriptions of the wireless communication device 10, which are omitted here. By performing the process 40, the wireless communication device 10 may detect the wireless communication system corresponding to the receiving signal in the environment to automatically and dynamically adjust the matching of the diversity antenna in the transmitting frequency band or the receiving frequency band, e.g. to weaken the antenna performance of the diversity antenna in the transmitting frequency band or the receiving frequency band, to reduce the influence of the diversity antenna to the main antenna, which effectively improves the isolation between the main antenna and the diversity antenna.

To sum up, the wireless communication device 10 of the present invention may detect the wireless communication system corresponding to the receiving signal in the environment to automatically and dynamically adjust the matching of the diversity antenna in the transmitting frequency band or the receiving frequency band, e.g. to weaken the antenna performance of the diversity antenna in the transmitting frequency band or the receiving frequency band, to reduce the influence of the diversity antenna to the main antenna, which effectively improves the isolation between the main antenna and the diversity antenna. As a result, the wireless communication device 10 of the present invention may optimize the isolation between the dual antennas according to the wireless communication system.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A wireless communication device, comprising:
a main antenna operating in a receiving frequency band to receive a receiving signal in the receiving frequency band;
a diversity antenna operating in the receiving frequency band to receive the receiving signal in the receiving frequency band;
a tunable matching circuit coupled to the main antenna and the diversity antenna for adjusting a matching of the diversity antenna according to a control signal;
a detection unit coupled to the tunable matching circuit for detecting a wireless communication system corresponding to the receiving signal to generate a detection result, wherein the detection result indicates an antenna configuration and a transmitting frequency band corresponding to the wireless communication system; and
a radio-frequency processing circuit coupled to the detection unit and the tunable matching circuit for determining whether to adjust the matching of the diversity antenna according to the antenna configuration indicated by the detection result to output the control signal to the tunable matching circuit, such that the tunable matching circuit adjusts the matching of the diversity antenna to conform to the antenna configuration;
wherein the radio-frequency processing circuit determines whether to weaken an antenna performance of the diversity antenna in both or one of the transmitting frequency band and the receiving frequency band according to the antenna configuration to improve an isolation between the diversity antenna and the main antenna;
wherein the tunable matching circuit comprises:
a first matching unit coupled to the main antenna for matching the main antenna;
a second matching unit coupled to the diversity antenna for matching the diversity antenna; and
a control unit coupled to the radio-frequency processing circuit, the first matching unit and the second matching unit for outputting the first and second adjusting signals to the first and second matching units according to the control signal to respectively adjust the matching of the main antenna and the diversity antenna;
wherein the first matching unit or the second matching unit comprises:
a first node coupled to the main antenna or the diversity antenna;
a second node coupled to the detection unit;
a first capacitor coupled to the first node;
a second capacitor having an end coupled to the first node and another end coupled to a ground terminal;
a first inductor having an end coupled to the first capacitor and another end coupled to the second node; and
a second inductor having an end coupled to the first node and another end coupled to the ground terminal.

2. The wireless communication device of claim 1, wherein the first capacitor and the second inductor function as a first filter, and the tunable matching circuit adjusts both or one of a capacitance of the first capacitor and an inductance of the second inductor to adjust the matching of the main antenna or the diversity antenna in a low frequency band.

3. The wireless communication device of claim 1, wherein the second capacitor and the first inductor function as a second filter, and the tunable matching circuit adjusts both or one of a capacitance of the second capacitor and an inductance of the first inductor to adjust the matching of the main antenna or the diversity antenna in a high frequency band.

4. The wireless communication device of claim 1, wherein the first and second capacitors and the first and second inductors are electrically tunable to adjust the capacitances and the inductances according to the first and second adjusting signals, wherein the capacitances of the first and second capacitors are tunable in a range from 0.2 to 15 picofarads, and the inductances of the first and second inductors are tunable in a range from 1 to 33 nanohenries.

5. The wireless communication device of claim 1, wherein if the antenna configuration indicates the diversity antenna is used for receiving only, the control signal indicates to the tunable matching circuit to adjust the matching of the diversity antenna to weaken the antenna performance of the diversity antenna in the transmitting frequency band, such that the diversity antenna does not operate in the transmitting frequency band to improve the isolation between the main antenna and the diversity antenna in the transmitting frequency band.

6. The wireless communication device of claim 1, wherein if the antenna configuration indicates the diversity antenna is not used for receiving and transmitting, the control signal indicates to the tunable matching circuit to adjust the matching of the diversity antenna to weaken the antenna performance of the diversity antenna in the receiving frequency band and the transmitting frequency band, such that the diversity antenna does not operate in the receiving frequency band and the transmitting frequency band to improve the isolation between the main antenna and the diversity antenna in the receiving frequency band and the transmitting frequency band.

7. The wireless communication device of claim 1, wherein the radio-frequency processing circuit comprises:
a radio-frequency modem for processing the receiving signal and generating the transmitting signal;
a storage unit for storing a matching information; and
a central processor coupled to the radio-frequency modem, the detection unit and the storage unit for accessing the matching information according to the antenna configuration indicated by the detection result to generate the control signal, and controlling the radio-frequency processing circuit to generate the transmitting signal to the main antenna and the diversity antenna.

* * * * *